(12) United States Patent
Moser et al.

(10) Patent No.: US 8,994,075 B1
(45) Date of Patent: Mar. 31, 2015

(54) HETEROJUNCTION BIPOLAR TRANSISTOR GEOMETRY FOR IMPROVED POWER AMPLIFIER PERFORMANCE

(71) Applicant: RF Micro Devices, Inc., Greensboro, NC (US)

(72) Inventors: Brian G. Moser, Jamestown, NC (US); Robert Saxer, Stokesdale, NC (US); Jing Zhang, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/051,998

(22) Filed: Oct. 11, 2013

(51) Int. Cl.
| | |
|---|---|
| H01L 31/0328 | (2006.01) |
| H01L 31/0336 | (2006.01) |
| H01L 31/072 | (2012.01) |
| H01L 31/109 | (2006.01) |
| H01L 29/737 | (2006.01) |
| H01L 29/10 | (2006.01) |

(52) U.S. Cl.
CPC ........ *H01L 29/7371* (2013.01); *H01L 29/1004* (2013.01)
USPC ............. 257/197; 257/E27.018; 257/E29.188

(58) Field of Classification Search
CPC .................. H01L 29/1004; H01L 29/7371
USPC ............................ 257/197, E27.018, E29.188
See application file for complete search history.

(56) References Cited

U.S. PATENT DOCUMENTS

| | | |
|---|---|---|
| 6,563,145 B1 | 5/2003 | Chang et al. |
| 6,586,782 B1 | 7/2003 | Finlay |
| 6,627,925 B1 | 9/2003 | Finlay |
| 8,159,048 B2 | 4/2012 | Apel et al. |
| 2014/0273323 A1* | 9/2014 | Kim .............................. 438/47 |

OTHER PUBLICATIONS

Apel, Thomas et al., "Switched Doherty Power Amplifiers for CDMA and WCDMA," 2007 IEEE Radio Frequency Integrated Circuits Symposium, Copyright: 2007, pp. 259-262.
Chen, James T. C. et al., "Bipolar Microwave Linear Power Transistor Design," IEEE Transactions on Microwave Theory and Techniques, vol. MTT-27, No. 5, May 1979, pp. 423-430.
Kroemer, Herbert, "Heterostructure Bipolar Transistors and Integrated Circuits," Proceedings of the IEEE, vol. 70, No. 1, Jan. 1982, pp. 13-25.
Murari, Bruno, "Power Integrated Circuits: Problems, Tradeoffs, and Solutions," IEEE Journal of Solid-State Circuits, vol. SC-13, No. 3, Jun. 1978, pp. 307-319.

(Continued)

*Primary Examiner* — David S Blum
(74) *Attorney, Agent, or Firm* — Withrow & Terranova, P.L.L.C.

(57) ABSTRACT

A heterojunction bipolar transistor includes a base mesa, an emitter assembly formed over the base mesa, and a base contact. The emitter assembly includes multiple circular sectors. Each circular sector is spaced apart from one another such that a sector gap is formed between radial sides of adjacent circular sectors. The base contact, which is formed over the base mesa, has a central portion and multiple radial members. Each radial member extends outward from the central portion of the base contact along a corresponding sector gap. As such, each of the circular sectors of the emitter assembly is separated by a radial member of the base contact. The number of circular sectors may vary from one embodiment to another. For example, the emitter assembly may have three, four, six, or more circular sectors.

24 Claims, 15 Drawing Sheets

(56) References Cited

OTHER PUBLICATIONS

Reimer, Christopher J. et al., "A Simulation Study of IC Layout Effects on Thermal Management of Die Attached GaAs Ics," IEEE Transactions on Components and Packaging Technologies, vol. 23, No. 2, Jun. 2000, pp. 341-351.

Tsai, Shu-Hsiao et al., "A Ultra High Ruggedness Performance of InGaP/GaAs HBT for Multi-Mode/Multi-Band Power Amplifier Application," CS MANTECH Conference, Apr. 23-26, 2012, 4 pages, Boston, Massachusetts.

Yeats, Bob, "Inclusion of Topside Metal Heat Spreading in the Determination of HBT Temperatures by Electrcal and Geometrical Methods," 21st Annual GaAs IC Symposium, Oct. 17-20, 1999, pp. 59-62.

Liu, William, "Chapter 10: Geometrical Layout Design," Handbook of III—Heterojunction Bipolar Transistors, Apr. 1998, pp. 141, 818-878, John Wiley & Sons.

* cited by examiner

HETEROJUNCTION BIPOLAR TRANSISTOR GEOMETRY FOR IMPROVED POWER AMPLIFIER PERFORMANCE

FIELD OF THE DISCLOSURE

The present disclosure relates to heterojunction bipolar transistors. Specifically, the present disclosure relates to geometric configurations for heterojunction bipolar transistors for improved performance of the transistor device.

BACKGROUND

Transistors are an essential component in modern mobile communications devices. Specifically, transistors play a vital role in the transmission and reception of radio frequency (RF) signals in the front end of a mobile communications device. Due to the decreasing form factor of mobile communications devices, the desire for a longer battery life, and support for an increasing number of stringent wireless communications standards, there is an ongoing need for smaller, more efficient transistor devices with improved performance characteristics.

As will be appreciated by those of ordinary skill in the art, one way to improve the performance of a transistor device operating at high frequencies (e.g., radio frequencies) is by using a heterojunction bipolar transistor. At high frequencies, heterojunction bipolar transistors offer many performance advantages over homojunction bipolar transistors. The performance advantages offered by heterojunction bipolar transistors primarily arise due to a wider energy bandgap in the material of the emitter of the device as compared to the energy bandgap in the material of the base of the device. The wider energy bandgap of the emitter material allows for many parameters dictating the performance of the device to be optimized for high frequencies without degrading the current gain of the device.

Equation 1 shows that the current gain of a heterojunction bipolar transistor has an exponential dependence on the difference in energy bandgap between the emitter and base of the device:

$$\beta = \frac{D_{nb} * x_e * N_e}{D_{pe} * X_b * N_b} * e^{\Delta E_g/kT} \quad (1)$$

where $\beta$ is the current gain of the heterojunction bipolar transistor, $D_{nb}$ and $D_{pe}$ are the diffusion constants of electrons in the base and holes in the emitter, respectively, $X_e$ and $X_b$ are the emitter thickness and base thickness, respectively, $N_e$ is the n-type emitter doping concentration, $N_b$ is the p-type base doping concentration, $\Delta E_g$ is the energy bandgap difference between the emitter and the base, k is the Boltzmann constant, and T is the temperature. The exponential dependence of the current gain ($\beta$) of the device on the difference in energy bandgap between the emitter and base allows the doping level of the material used in the base of the device ($N_b$) to be maximized and the doping level of the material used in the emitter of the device ($N_e$) to be reduced without pushing the current gain ($\beta$) of the device to un-usable levels. The more flexible doping concentrations afforded by using a heterojunction bipolar transistor allow for a lower base resistance and base-emitter capacitance. Further, the high doping concentrations allowed for the base material result in a decreased base thickness and electron transit time. The lower base resistance and base-emitter capacitance offered by heterojunction bipolar transistors provide performance improvements at high frequencies.

One way to further improve the performance of the heterojunction bipolar transistor is by altering the base-collector capacitance and the base resistance of the device. The base-collector capacitance has been shown to significantly improve the small signal gain of a heterojunction bipolar transistor device. This small signal gain improvement can translate into large signal gain improvements in a power amplifier. Therefore, minimizing the base-collector capacitance is critical for improving the large signal gain in both linear and saturated power amplifiers. Further, minimizing the base resistance will also improve the large signal gain of both linear and saturated power amplifiers. One such metric to gauge the small signal improvement is the maximum frequency of oscillation. Other small signal metrics such as maximum available gain and maximum stable gain are also important to measure device improvements through base-collector capacitance and base resistance changes. Equation 2 shows the dependence of the maximum frequency of oscillation for a heterojunction bipolar device on the base-collector capacitance and the base resistance:

$$f_{max} \approx \frac{f_t}{\sqrt{8\pi * R_b * C_{bc}}} \quad (2)$$

where $f_{max}$ is the maximum frequency of oscillation, $f_t$ is the cutoff frequency of the device, $R_b$ is the base resistance, and $C_{bc}$ is the base-collector capacitance. The maximum frequency of oscillation ($f_{max}$), in conjunction with small signal gain metrics, provides a rapidly measurable predictor of large signal gain improvements. Accordingly, minimizing the base-collector capacitance ($C_{bc}$) and the base resistance ($R_b$) of the device play a crucial role in improving the performance of a heterojunction bipolar transistor.

The geometric layout of a heterojunction bipolar transistor has been shown to have significant effects on both the base-collector capacitance and the base resistance of the device. Two quantities can be defined in order to compare the potential performance of a particular geometric layout for a heterojunction bipolar transistor: the emitter area to base-collector junction area ratio ($A_e/A_{bp}$), and the emitter perimeter to base-contact perimeter ratio ($P_e/P_{bc}$). The emitter area to base-collector junction area ratio ($A_e/A_{bp}$) compares the area of the emitter to the area of the junction between the collector and the base. A larger ratio of emitter area to base-collector pedestal area ($A_e/A_{bp}$), generally results in a lower base-collector capacitance ($C_{bc}$). Ideally, the $A_e/A_{bp}$ ratio would be one, but this is not practically achievable. Conversely, a smaller ratio of emitter perimeter to base contact perimeter ($P_e/P_{bc}$), indicates a lower base resistance ($R_b$). To determine the base resistance, analytical calculations can be done using the heterojunction bipolar transistor geometry and the specific base material properties and base metal contact resistance. However, the emitter perimeter to base contact perimeter ratio is a straightforward and quick calculation to compare the trends in base resistance with geometry. As will be appreciated by those of ordinary skill in the art, these quantities are often provided as a trade-off, and therefore decreasing the base-collector capacitance of the device often comes at the expense of an increased base resistance, and vice-versa. Accordingly, the geometric configuration of a heterojunction bipolar device may dictate the performance of the device.

In addition to affecting the base-collector capacitance and base resistance of a heterojunction bipolar transistor, the geometric layout also significantly affects the thermal properties of the device. For example, the geometric layout of a heterojunction bipolar transistor may affect the heat dissipation characteristics of the emitter of the device. The heat dissipation characteristics of the emitter of the device may become increasingly important as current through the device is increased. Increased current through the heterojunction bipolar transistor may cause excessive heat to accumulate in the emitter, leading to decreased performance and damage to the device. Accordingly, the geometric configuration of a heterojunction bipolar transistor may also dictate the performance of the device in this manner.

FIG. 1 shows a three-dimensional representation of a conventional heterojunction bipolar transistor 10 including a "bar" geometric configuration. The conventional heterojunction bipolar transistor includes a sub-collector 12, a base mesa 14 on a surface of the sub-collector 12, one or more collector contacts 16 adjacent to the base mesa 14 on the surface of the sub-collector 12, a base contact 20 on a surface of the base mesa 14 opposite the sub-collector 12, and an emitter assembly 22 on the surface of the base mesa 14 opposite the sub-collector 12. The base mesa 14 includes a collector layer 17 and a base layer 18.

As shown in FIG. 1, the base mesa 14 is a pyramidal shape including a flat rectangular surface opposite the sub-collector 12. The base contact 20 of the conventional heterojunction bipolar transistor is a "U" shape that encloses the rectangular emitter assembly 22 on three sides. The emitter assembly 22 includes an emitter layer 24, an emitter cap layer 26, and an emitter contact 28. As discussed above, the geometric configuration of the base contact 20 and the emitter assembly 22 may significantly affect the performance characteristics of the conventional heterojunction bipolar transistor 10. Accordingly, several similar "bar" geometric configurations for the base contact 20 and the emitter assembly 22 are commonly employed to improve the performance of the device, as shown in FIGS. 2A-2C.

FIG. 2A shows a two-dimensional representation of the base contact 20 and the emitter assembly 22 of FIG. 1, wherein the base contact 20 surrounds the emitter assembly 22 on three sides. FIG. 2B shows a similar layout to that of FIG. 2A, except the emitter assembly 22 includes two rectangular portions, each rectangular portion surrounded on three sides by an "E" shaped base contact 20. Finally, FIG. 2C shows an emitter assembly 22 including two rectangular portions that are surrounded on two sides by a "T" shaped base contact 20. While the "bar" geometric configurations shown in FIGS. 2A and 2B offer a low emitter perimeter to base contact perimeter ratio ($P_e/P_{bc}$), resulting in a relatively small base resistance ($R_b$), the emitter area to base-collector junction area ratio ($A_e/A_{bp}$) is also low, resulting in an undesirably large base-collector capacitance ($C_{bc}$). Comparing FIGS. 2B and 2C with equal total emitter area, FIG. 2B will have a lower base-collector junction area ratio but a lower emitter perimeter to base-contact perimeter ratio. For device parameters, FIG. 2B would have a larger base-collector capacitance but smaller base resistance. These figures illustrate some of the common heterojunction bipolar transistor geometric trade-offs.

FIG. 3 shows a three-dimensional representation of a conventional heterojunction bipolar transistor 30 including an "annular" geometric configuration. The conventional heterojunction bipolar transistor 30 includes a sub-collector 32, a base mesa 34 on a surface of the sub-collector 32, one or more collector contacts 36 adjacent to the base mesa 34 on the surface of the sub-collector 32, a base contact 40 on a surface of the base mesa 34 opposite the sub-collector 32, and an emitter assembly 42 on the surface of the base mesa 34 opposite the sub-collector 32. The base mesa 34 includes a collector layer 37 and a base layer 38.

As shown in FIG. 3, the base mesa 34 is a tapered cylinder including a flat circular surface opposite the sub-collector 32. The base contact 40 of the conventional heterojunction bipolar transistor 30 is a circular shape, which is substantially enclosed by the ring-shaped emitter assembly 42 with a small opening. The emitter assembly 42 includes an emitter layer 44, an emitter cap layer 46, and an emitter contact 48.

FIG. 4 shows a two-dimensional representation of the base contact 40 and the emitter assembly 42 of FIG. 3, wherein the circular base contact 40 is substantially surrounded by the ring-shaped emitter assembly 42 with a small opening. While the "annular" layout shown in FIGS. 3 and 4 offers a high emitter area to base-collector junction area ratio ($A_e/A_{bp}$), resulting in a relatively small base-collector capacitance ($C_{bc}$), the emitter perimeter to base contact perimeter ratio ($P_e/P_{bc}$) is also high, resulting in an undesirably large base resistance ($R_b$).

FIG. 5 shows a three-dimensional representation of a conventional heterojunction bipolar transistor 50 including a "meander" geometric configuration. The conventional heterojunction bipolar transistor 50 includes a sub-collector 52, a base mesa 54 on a surface of the sub-collector 52, one or more collector contacts 56 adjacent to the base mesa 54 on the surface of the sub-collector 52, a base contact 60 on a surface of the base mesa 54 opposite the sub-collector 52, and an emitter assembly 62 on the surface of the base mesa 54 opposite the sub-collector 52. The base mesa 54 includes a collector layer 57 and a base layer 58.

As shown in FIG. 5, the base mesa 54 is a pyramid shape including a flat rectangular surface opposite the sub-collector 52. The base contact 60 of the conventional heterojunction bipolar transistor 50 includes a central rectangular base connecting several rectangular fingers, which are laterally separated from one another. The emitter assembly 62 is formed around the base contact 60 with a rectangular outer edge. The emitter assembly 62 includes an emitter layer 64, an emitter cap layer 66, and an emitter contact 68.

FIG. 6 shows a two-dimensional representation of the base contact 60 and the emitter assembly 62 of FIG. 5, wherein the base contact 60 is substantially surrounded by the emitter assembly 62. While the "meander" layout shown in FIGS. 5 and 6 offers a relatively moderate base emitter perimeter to base contact perimeter ratio ($P_e/P_{bc}$) and emitter area to base-collector junction area ratio ($A_e/A_{bp}$), resulting in a moderate base resistance ($R_b$) and base-collector capacitance ($C_{bc}$), the performance of the device still has room for improvement.

The geometric configurations described above may offer some performance improvements for a heterojunction bipolar transistor device, however, there is a need for a heterojunction bipolar transistor device with further improved performance, including a better trade-off between the base-collector capacitance and base resistance.

SUMMARY

The present disclosure relates to a heterojunction bipolar transistor having a base mesa, an emitter assembly formed over the base mesa, and a base contact. The emitter assembly is divided into multiple circular sectors. Each circular sector is spaced apart from one another such that a sector gap is formed between radial sides of adjacent circular sectors. The base contact, which is formed over the base mesa, has a central portion and multiple radial members. Each radial member extends outward from the central portion of the base contact along a corresponding sector gap. As such, each of the circular sectors of the emitter assembly is separated by a radial member of the base contact. The number of circular sectors may vary from one embodiment to another. For example, the emitter assembly may have three, four, six, or more circular sectors.

By arranging the base contact and the emitter assemblies as described, the base-collector capacitance and the base resistance associated with the heterojunction bipolar transistor are minimized, thereby improving the performance of the device. Further, the footprint of the device is substantially reduced, thereby saving valuable real estate in a device in which the heterojunction bipolar transistor is incorporated.

According to one embodiment, a heterojunction bipolar transistor includes a base mesa, an emitter assembly formed over the base mesa, and a base contact. The emitter assembly is divided into multiple rectangular portions. Each rectangular portion is spaced apart from one another such that a gap is formed between the adjacent sides of the rectangular portions. The base contact, which is formed over the base mesa, has a central portion and multiple radial members. Each radial member extends outward from the central portion of the base contact along a corresponding gap between the rectangular emitter portions. As such, each of the rectangular portions of the emitter assembly is separated by a radial member of the base contact.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
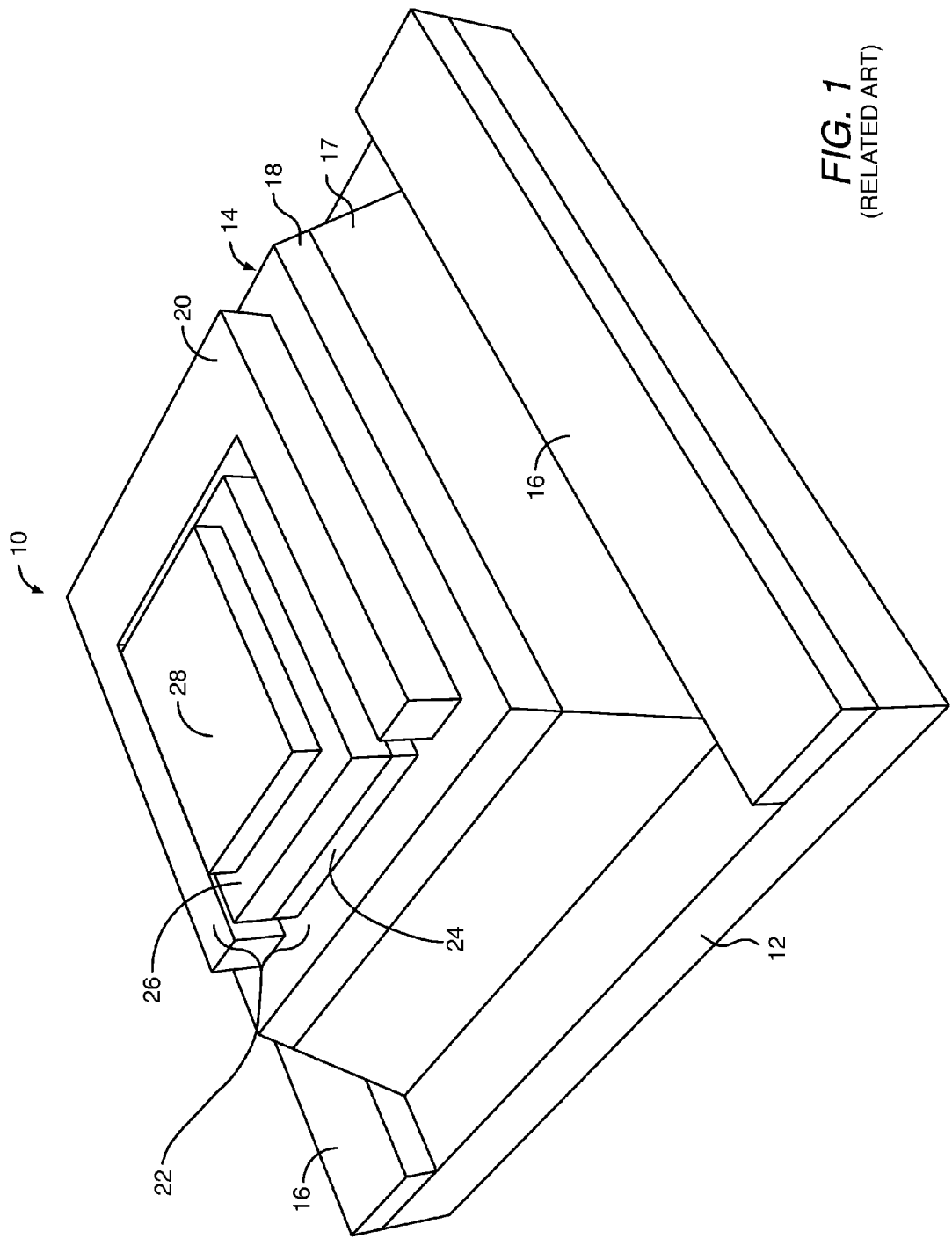
FIG. 1 shows a three-dimensional representation of a conventional heterojunction bipolar transistor including a "bar" geometric configuration.
Figures 2A, 2B, 2C:
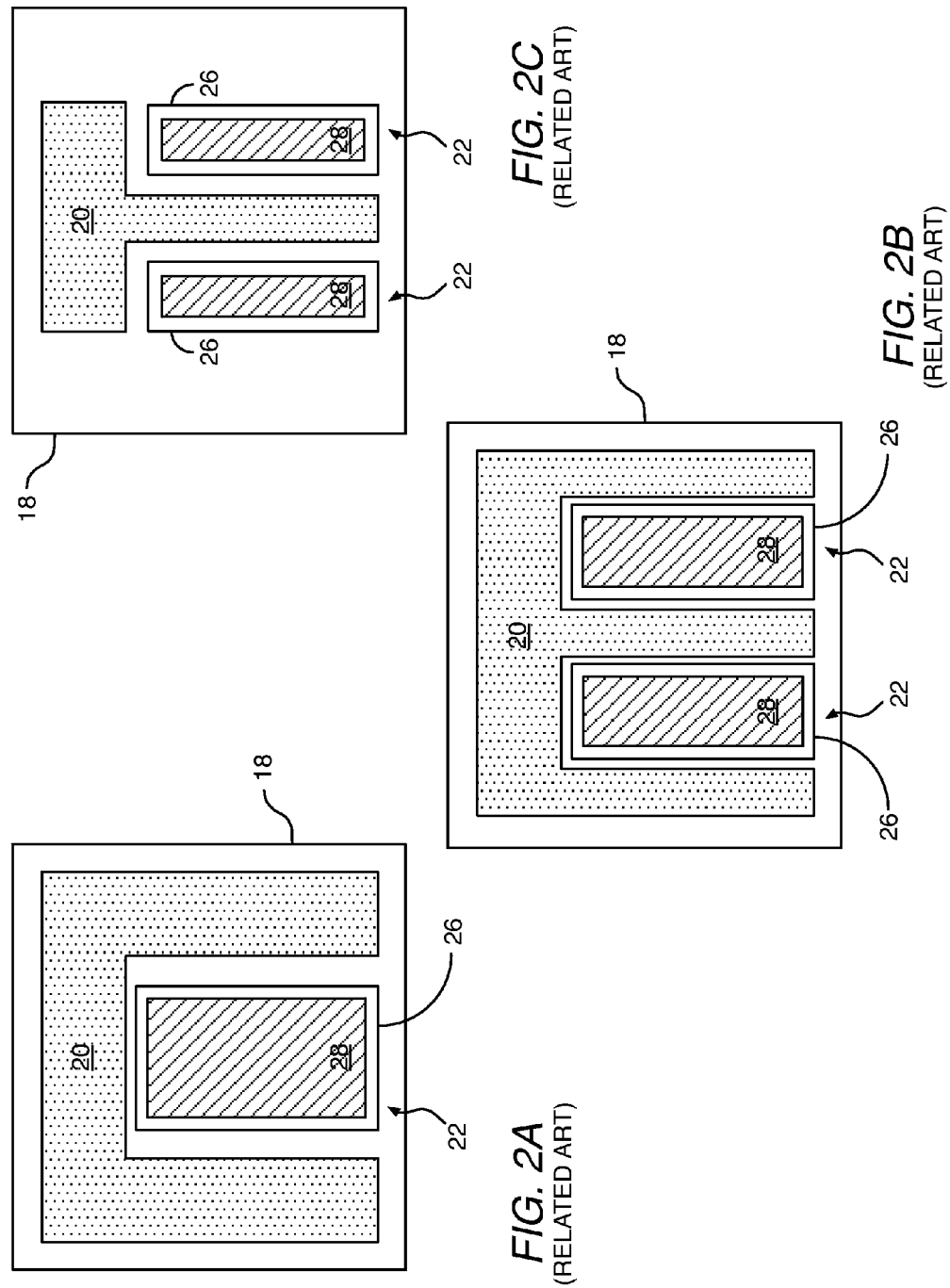
FIGS. 2A-2C show two-dimensional representations of additional "bar" geometric configurations for a heterojunction bipolar transistor.
Figure 3:
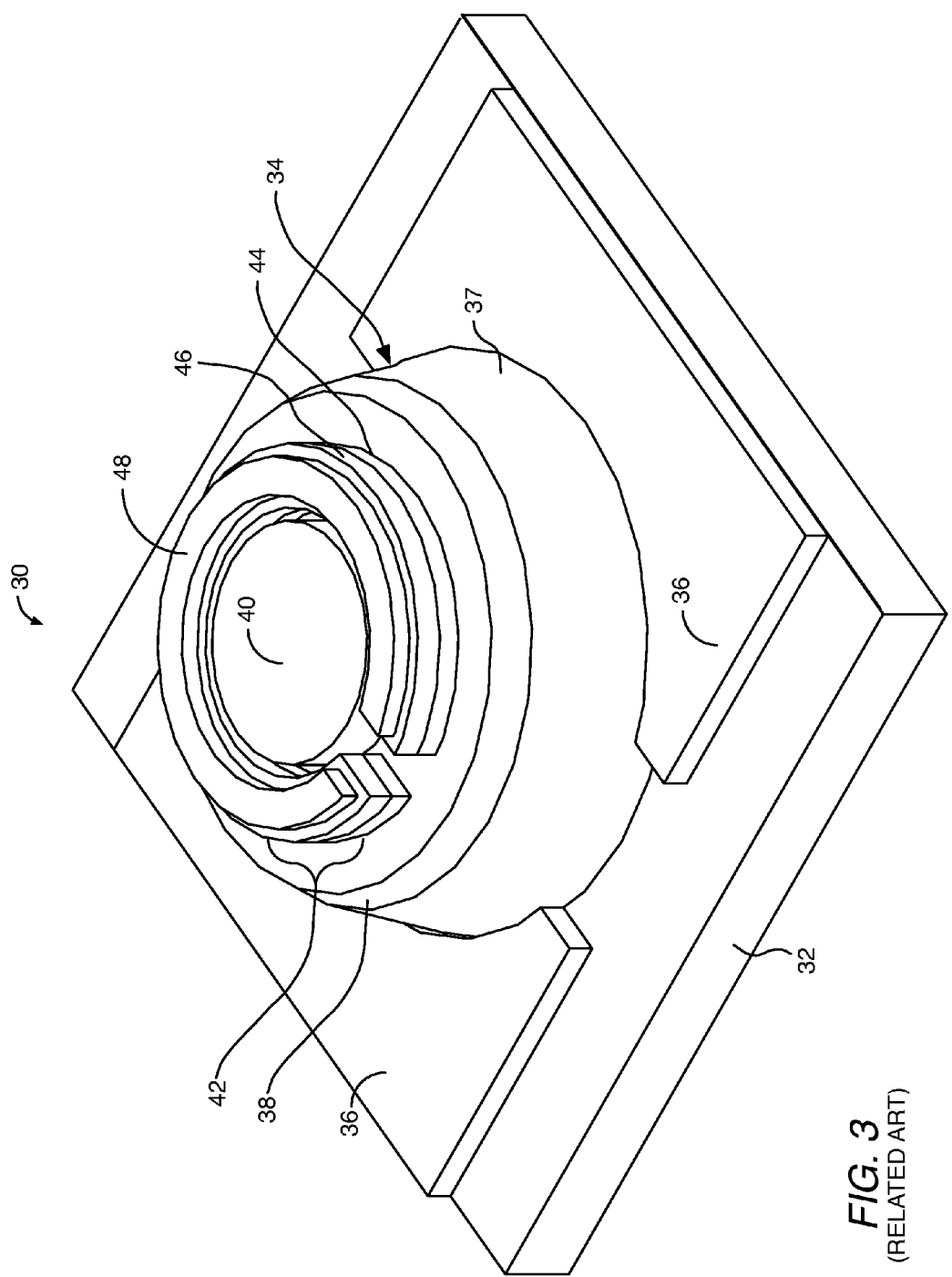
FIG. 3 shows a three-dimensional representation of a conventional heterojunction bipolar transistor including an "annular" geometric configuration.
Figure 4:
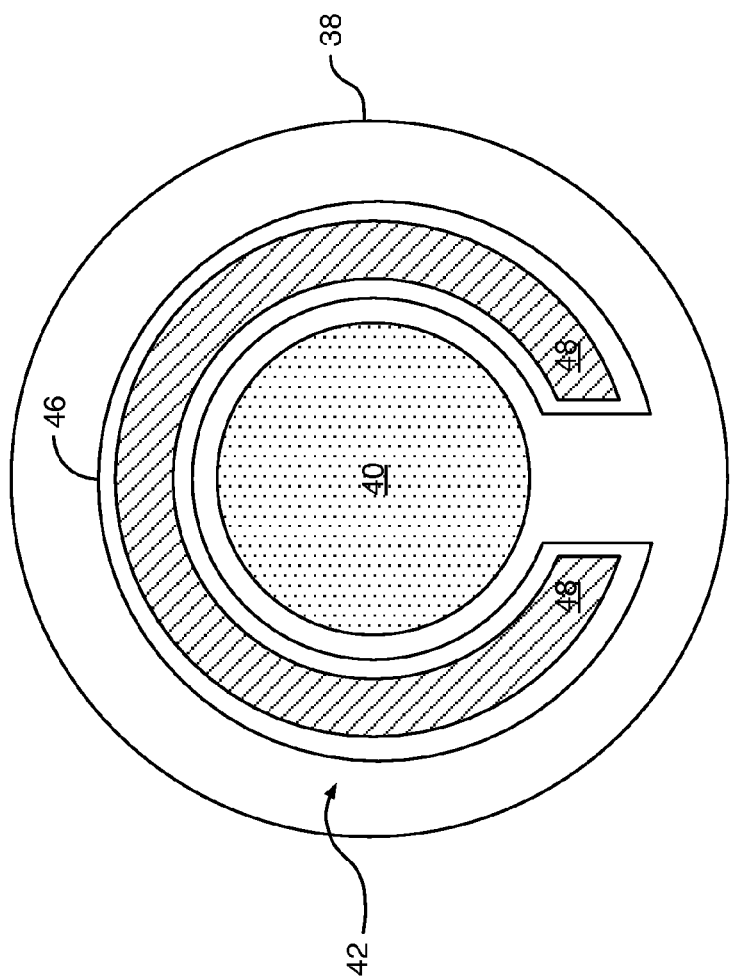
FIG. 4 shows a two-dimensional representation of the "annular" geometric configuration shown in FIG. 3.
Figure 5:
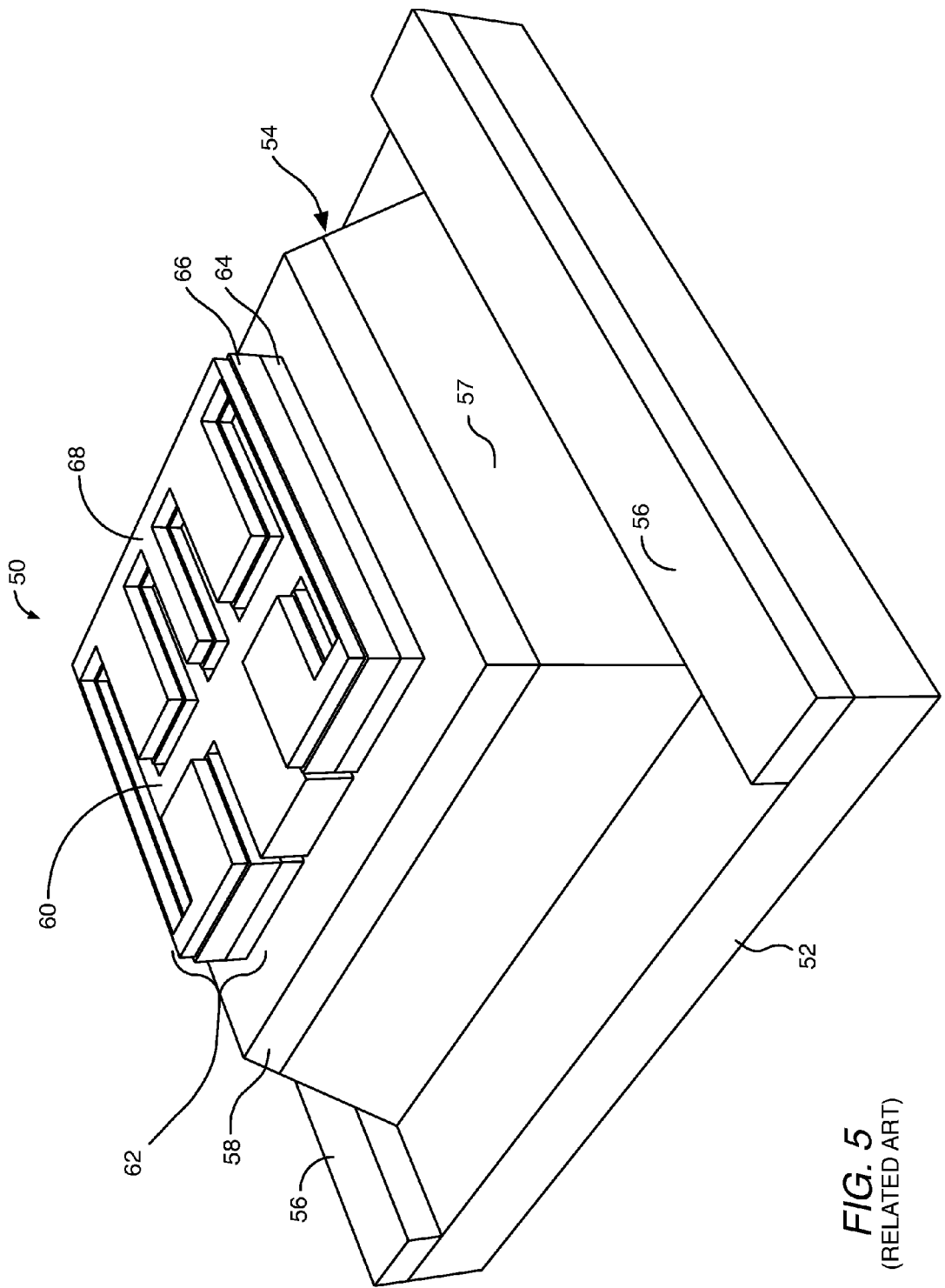
FIG. 5 shows a conventional heterojunction bipolar transistor including a "meander" geometric configuration.
Figure 6:
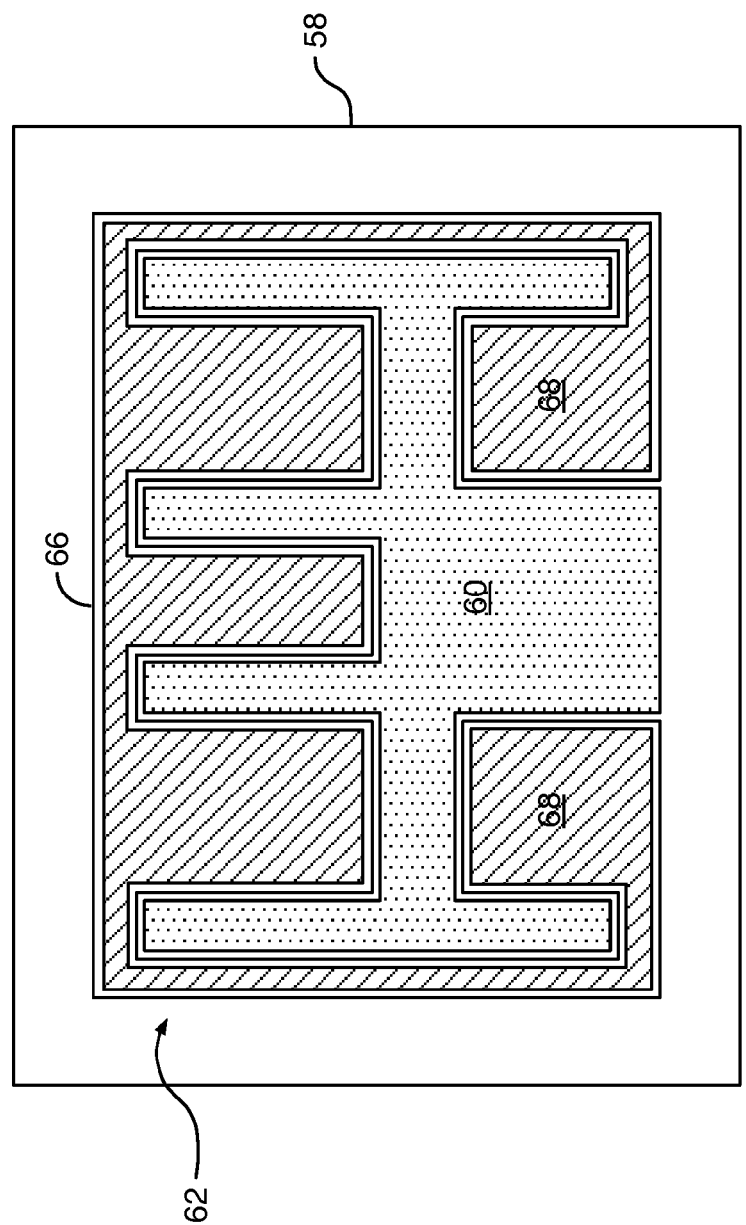
FIG. 6 shows a two-dimensional representation of the "meander" geometric configuration shown in FIG. 5.
Figure 7:
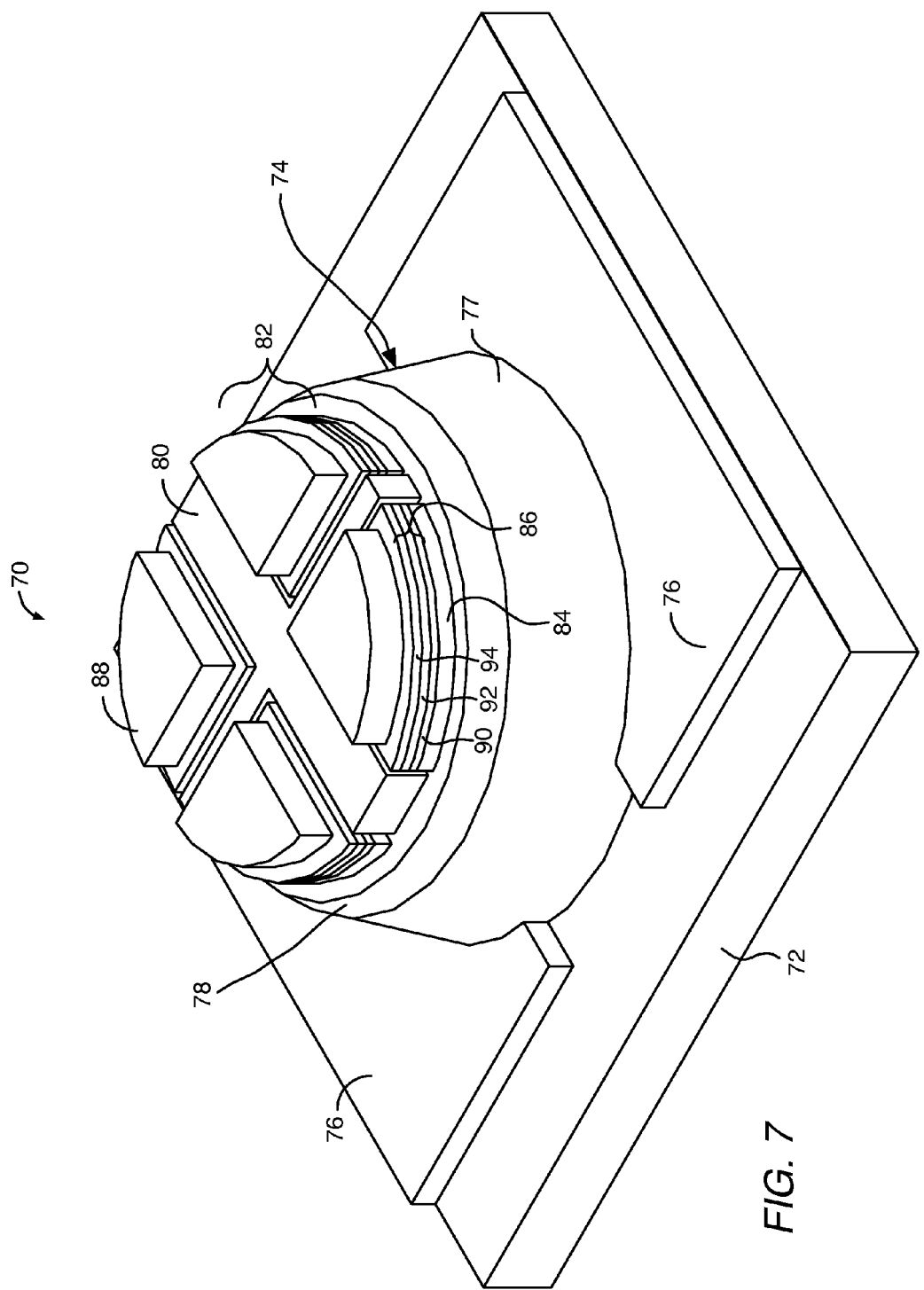
FIG. 7 shows a three-dimensional representation of a heterojunction bipolar transistor including a "pie" geometric configuration according to one embodiment of the present disclosure.

Turning now to FIG. 7, a heterojunction bipolar transistor 70 is shown including a "pie" geometric configuration according to one embodiment of the present disclosure. The heterojunction bipolar transistor 70 may include a sub-collector 72, a base mesa 74 on a surface of the sub-collector 72, one or more collector contacts 76 adjacent to the base mesa 74 on the surface of the sub-collector 72, a base contact 80 on a surface of the base mesa 74 opposite the sub-collector 72, and an emitter assembly 82 on the surface of the base mesa 74 opposite the sub-collector 72. The base mesa 74 may include a collector layer 77 and a base layer 78.

The emitter assembly 82 may include an emitter layer 84, an emitter cap layer 86, and an emitter contact 88. Further, the emitter cap layer 86 may be comprised of multiple layers. For example, the emitter cap layer 86 may comprise an emitter interface layer 90, an intermediate layer 92, and an emitter contact interface layer 94. The emitter cap layer 86 may be adapted to lower the resistance between the emitter contact 88 and the emitter layer 84 in order to improve the performance of the heterojunction bipolar transistor 70.

The heterojunction bipolar transistor 70 may be an indium-gallium phosphide (InGaP)/gallium arsenide (GaAs) device. Those of ordinary skill in the art will appreciate that the principles of the present disclosure can be applied to any materials system. The sub-collector 72 may be an n-doped layer with a thickness in the thousands of angstroms and a doping concentration about $10^{18}$ cm$^3$. The collector layer 77 may be an n-doped layer with a thickness from 3000 angstroms to 20000 angstroms and a doping concentration from about $10^{15}$ cm$^{-3}$ to $10^{17}$ cm$^{-3}$. The base layer 78 may be a p-doped layer with a thickness in the range of 500 angstroms to 2000 angstroms and a doping concentration from about $5\times10^{18}$ cm$^{-3}$ to $1\times10^{20}$ cm$^{-3}$. The emitter layer 84 may be an n-doped layer with a thickness in the hundreds of angstroms and a doping concentration from about $10^{18}$ cm$^{-3}$ to $10^{18}$ cm$^{-3}$. The emitter interface layer 90 may be an n-doped layer with a thickness in the hundreds to thousands of angstroms and a doping concentration about $10^{19}$ cm$^{-3}$. The intermediate layer 92 may be an n-doped layer with a thickness in the hundreds of angstroms and a doping concentration about $10^{19}$ cm$^{-3}$. The emitter contact interface layer 94 may be an n-doped layer with a thickness about in the hundreds of angstroms and a doping concentration about $10^{19}$ cm$^{-3}$.

The collector contacts 76, the base contact 80, and the emitter contacts 88 may be comprised of various metal layers. Those of ordinary skill in the art will appreciate that the principles of the present disclosure can be applied to transistors having contacts comprised of any material.

Figure 8:
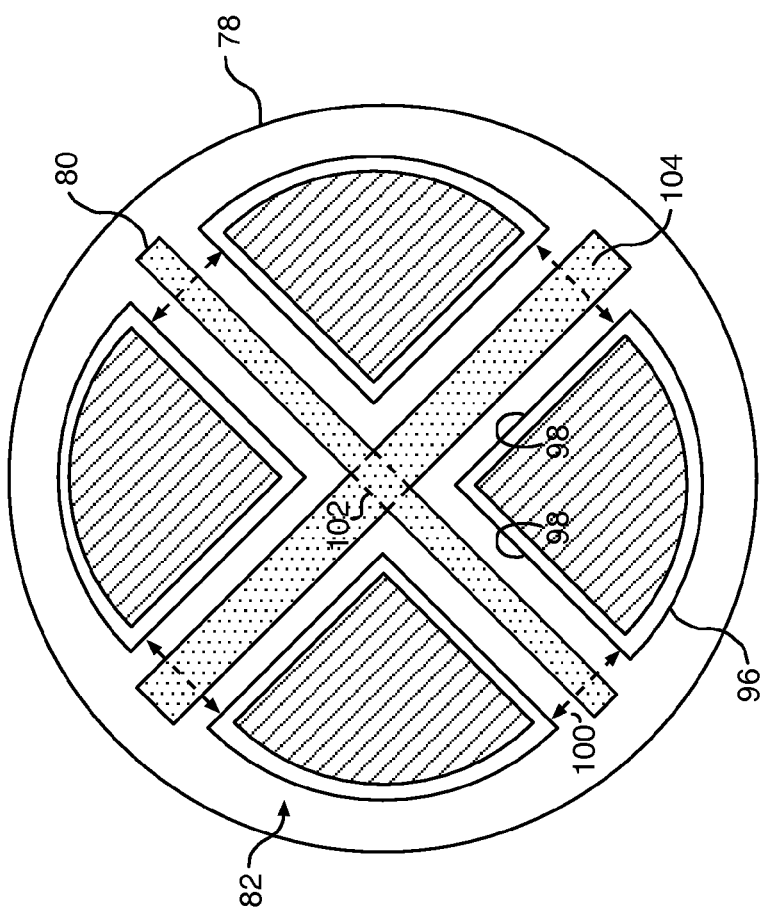
FIG. 8 shows a two-dimensional representation of the "pie" geometric configuration shown in FIG. 7 according to one embodiment of the present disclosure.

FIG. 8 shows a two-dimensional representation of the "pie" geometric configuration for the heterojunction bipolar transistor 70 shown in FIG. 7. As shown in FIGS. 7 and 8, the base mesa 74 may be a tapered cylinder including a flat circular surface opposite the sub-collector 72. The emitter assembly 82 may be divided into four circular sectors, each sector including a circular outer surface 96 and two straight radial surfaces 98. The circular sectors of the emitter assembly 82 may be spaced apart from one another, such that a sector gap 100 is formed between the radial surfaces 98 of adjacent circular sectors. The base contact 80 may be formed in an "X" shape, and may include a central portion 102 with four radial members 104. Each radial member 104 of the base contact 80 may extend outward from the central portion 102 along a corresponding sector gap 100, such that each one of the circular sectors of the emitter assembly 82 is separated by a radial member 104 of the base contact 80. Further, each radial member 104 of the base contact 80 may be a different width.

According to one embodiment, the area of the emitter assembly 82 is approximately 320 µm$^2$. In additional embodiments, the area of the emitter assembly 82 may be approximately 90 µm$^2$ to 320 µm$^2$. Although four circular sectors are shown in the emitter assembly 82 of FIGS. 7 and 8, any number of circular sectors may be used in the emitter assembly 82 without departing from the principles of the present disclosure. Further, although four radial members 104 are shown in the base contact 80 of FIGS. 7 and 8, any number of radial members 104 may be used in the base contact 80 without departing from the principles of the present disclosure.

By arranging the base contact 80 and the emitter assembly 82 in the "pie" configuration, the emitter area to base-collector junction area ratio ($A_e/A_{bp}$) can be maintained relatively high when compared to the conventional solutions, while the emitter perimeter to base contact perimeter ratio ($P_e/P_{bc}$) can be maintained relatively low. In doing so, the "pie" geometric configuration allows for a balanced trade-off between the base-collector capacitance ($C_{bc}$) and the base resistance ($R_b$), thereby leading to increased performance of the heterojunction bipolar transistor 70 over a variety of operating conditions. Further, the "pie" geometric configuration offers a substantially reduced footprint when compared to conventional bar solutions, thereby saving space in a device in which the heterojunction bipolar transistor 70 is integrated.

Figure 9:
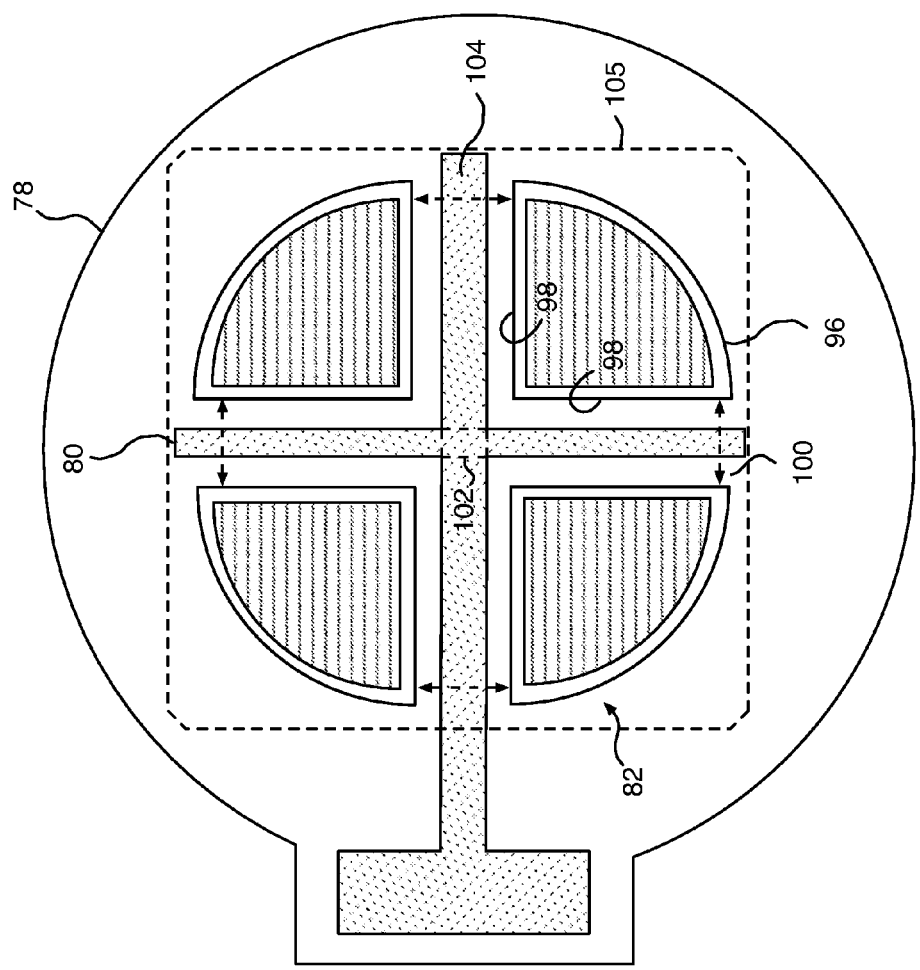
FIG. 9 shows a two-dimensional representation of the "pie" geometric configuration shown in FIG. 7 according to an additional embodiment of the present disclosure.

According to an additional embodiment, the heterojunction bipolar transistor 70 shown in FIGS. 7 and 8 may further include additional metals to enable easier routing from the heterojunction bipolar transistor 70 to one or more interconnect metals. FIG. 9 shows a two-dimensional representation of the "pie" geometric configuration for the heterojunction bipolar transistor 70 shown in FIG. 7 according to such an embodiment. The heterojunction bipolar transistor 70 includes a common emitter contact layer 105 located on top of each one of the emitter contacts 88, which provides a common connection point for each one of the emitter contacts 88. Accordingly, each one of the emitter contacts 88 may be more conveniently accessed. In addition to the common emitter contact layer 105, the base contact 80 may be extended and shaped to provide easier access thereto, as shown in FIG. 9. By arranging the heterojunction bipolar transistor 70 as shown, the base contact 80 and the emitter contacts 88 may be more easily connected to one or more interconnect metals associated with the heterojunction bipolar transistor 70.

Figure 10:
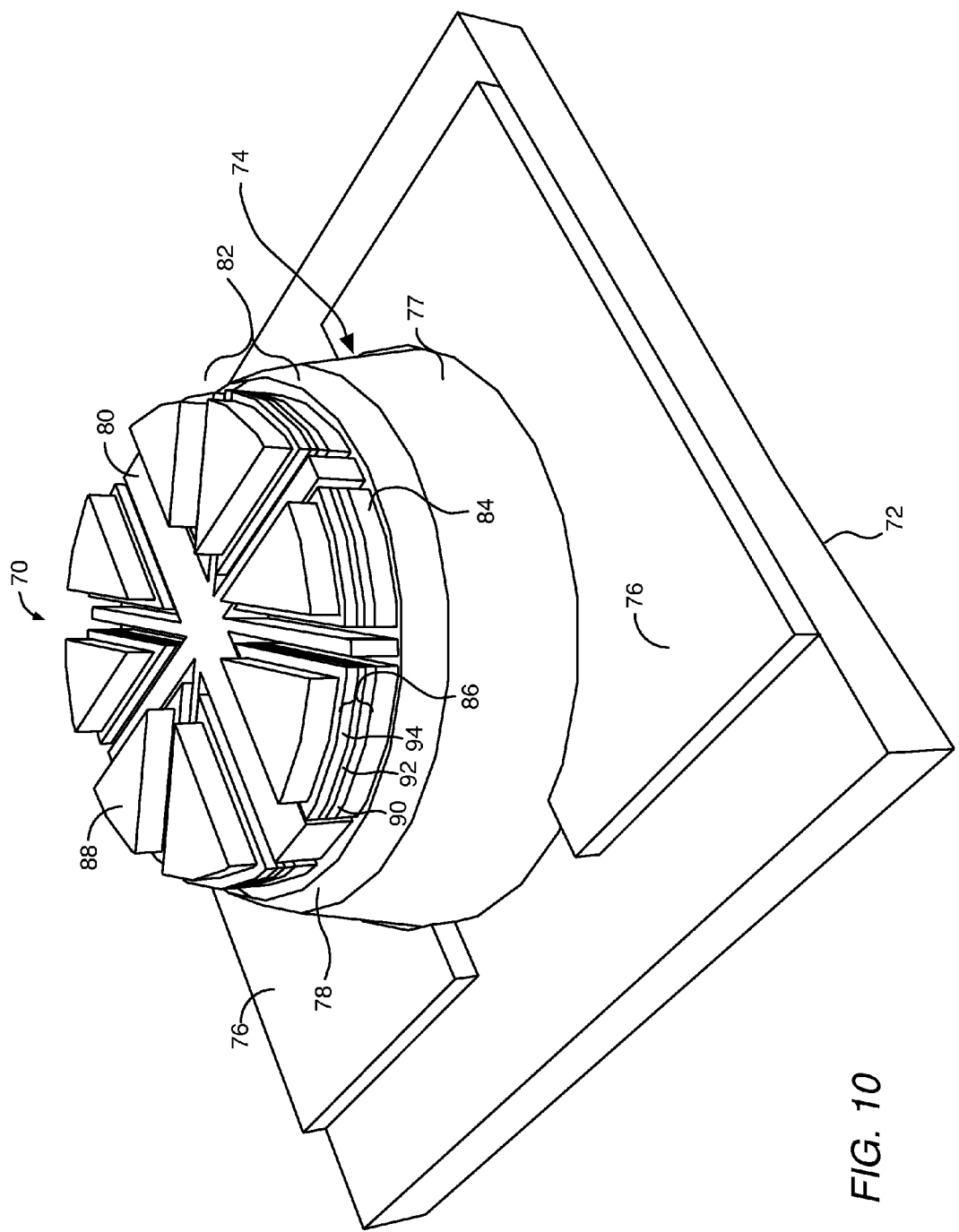
FIG. 10 shows a three-dimensional representation of a heterojunction bipolar transistor including a "pie" geometric configuration according to an additional embodiment of the present disclosure.

FIG. 10 shows a three-dimensional representation of the heterojunction bipolar transistor 70 according to an additional embodiment of the present disclosure. The heterojunction bipolar transistor 70 shown in FIG. 10 is substantially similar to that shown in FIG. 7, but uses an alternate "pie" geometric configuration for the base contact 80 and the emitter assembly 82, wherein the base contact 80 includes eight radial members and the emitter assembly 82 includes eight circular sectors.

Figure 11:
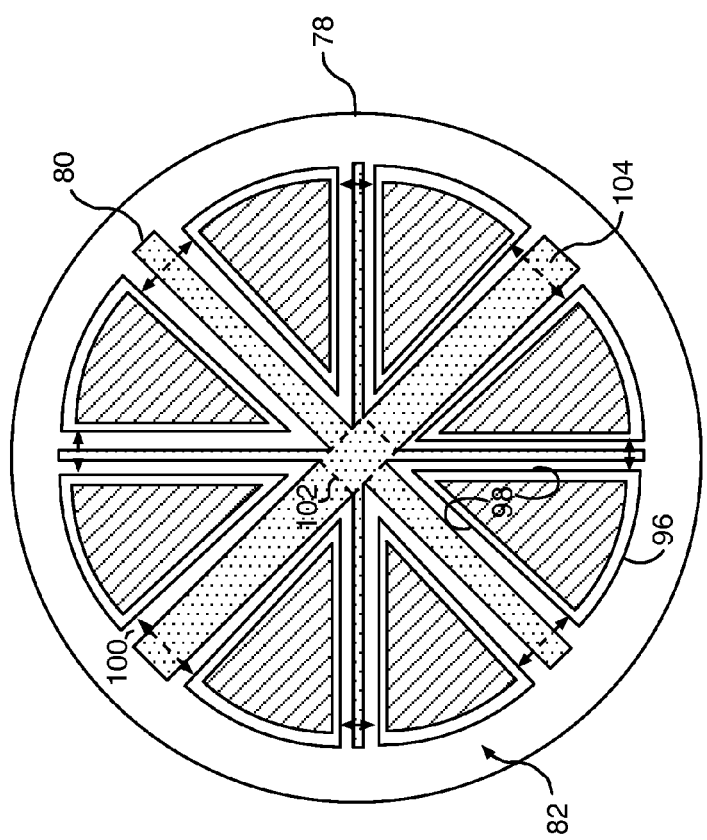
FIG. 11 shows a two-dimensional representation of the "pie" geometric configuration shown in FIG. 9.

FIG. 11 shows a two-dimensional representation of the "pie" geometric configuration for the heterojunction bipolar transistor 70 shown in FIG. 10. As shown in FIGS. 10 and 11, the emitter assembly 82 may be divided into eight circular sectors, each sector including a circular outer surface 96 and two straight radial surfaces 98. The circular sectors of the emitter assembly 82 may be spaced apart from one another, such that a sector gap 100 is formed between the two straight radial surfaces 98 of adjacent circular sectors. The base contact 80 may be formed in a star shape, and may include a central portion 102 with eight radial members 104. Each radial member 104 of the base contact 80 may extend outward from the central portion 102 along a corresponding sector gap 100, such that each one of the circular sectors of the emitter assembly 82 is separated by a radial member 104 of the base contact 80. Further, each radial member 104 of the base contact 80 may be a different width.

By arranging the base contact 80 and the emitter assembly 82 in the "pie" configuration, the emitter area to base-collector junction area ratio ($A_e/A_{bp}$) can be maintained relatively high when compared to the conventional solutions, while the emitter perimeter to base contact perimeter ratio ($P_e/P_{bc}$) can be maintained relatively low. In doing so, the "pie" geometric configuration allows for a balanced trade-off between the base-collector capacitance ($C_{bc}$) and the base resistance ($R_b$), thereby leading to increased performance of the heterojunction bipolar transistor 70 over a variety of operating conditions. Further, the "pie" geometric configuration offers a substantially reduced footprint when compared to conventional bar solutions, thereby saving space in a device in which the heterojunction bipolar transistor 70 is integrated.

Figure 12:
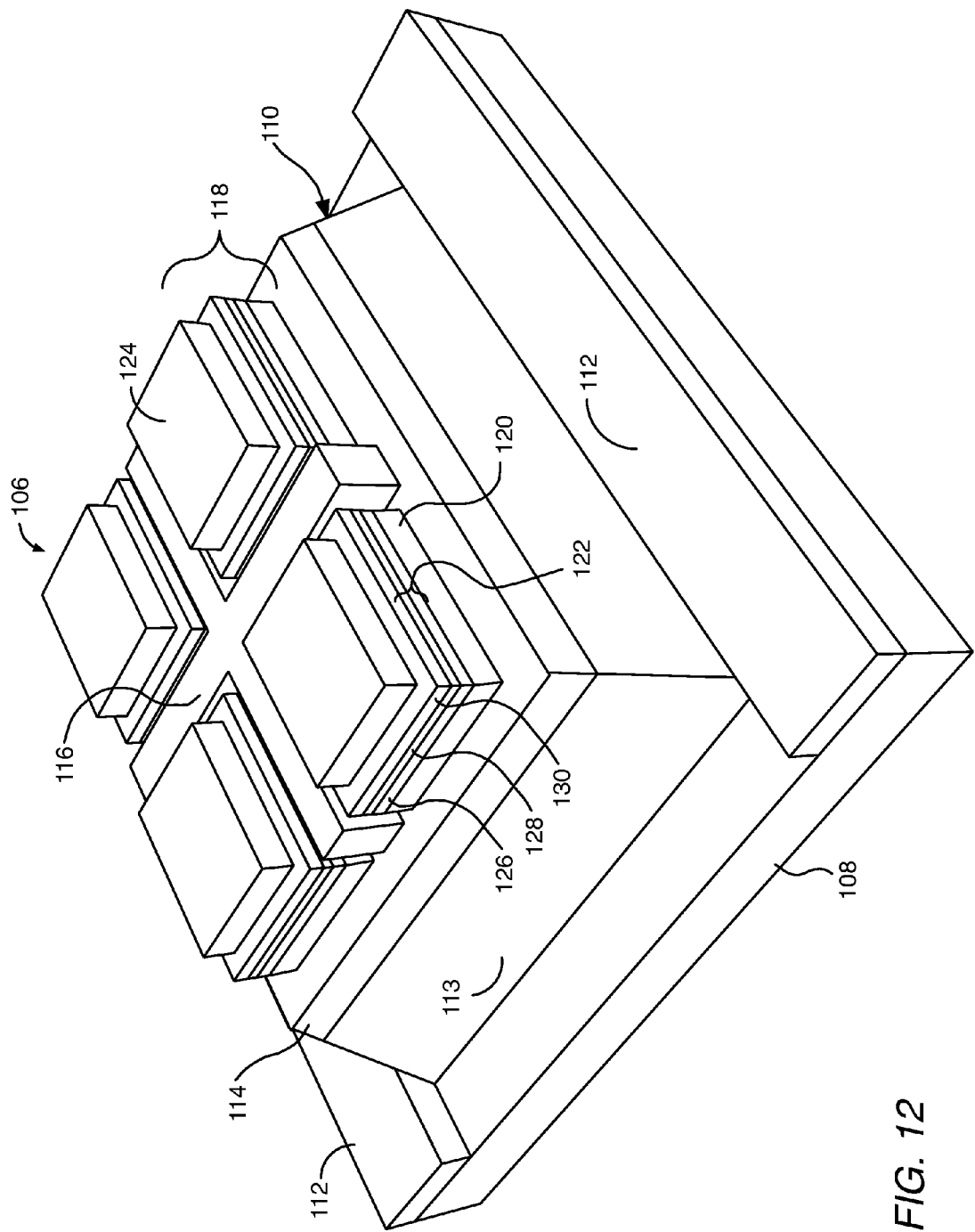
FIG. 12 shows a three-dimensional representation of a heterojunction bipolar transistor including a "square pie" geometric configuration according to an additional embodiment of the present disclosure.

FIG. 12 shows a three-dimensional representation of a heterojunction bipolar transistor 106 including a "square pie" geometric configuration according to one embodiment of the present disclosure. The heterojunction bipolar transistor 106 may include a sub-collector 108, a base mesa 110 on a surface of the sub-collector 108, one or more collector contacts 112 adjacent to the base mesa 110 on the surface of the sub-collector 108, a base contact 116 on a surface of the base mesa 110 opposite the sub-collector 108, and an emitter assembly 118 on the surface of the base mesa 110 opposite the sub-collector 108. The base mesa 110 may include a collector layer 113 and a base layer 114.

The emitter assembly 118 may include an emitter layer 120, an emitter cap layer 122, and an emitter contact 124. Further, the emitter cap layer 122 may be comprised of multiple layers. For example, the emitter cap layer 122 may comprise an emitter interface layer 126, an intermediate layer 128, and an emitter contact interface layer 130. The emitter cap layer 122 may be adapted to lower the resistance between the emitter contact 124 and the emitter layer 120 in order to improve the performance of the heterojunction bipolar transistor 106.

The heterojunction bipolar transistor 106 may be an indium-gallium phosphide (InGaP)/gallium arsenide (GaAs) device. Those of ordinary skill in the art will appreciate that the principles of the present disclosure can be applied to any materials system. The sub-collector 108 may be an n-doped layer with a thickness in the thousands of angstroms and a doping concentration about $10^{18}$ cm$^{-3}$. The collector layer 113 may be an n-doped layer with a thickness about 3000 angstroms to 20000 angstroms and a doping concentration from about $10^{15}$ cm$^{-3}$ to $10^{17}$ cm$^{-3}$. The base layer 114 may be a p-doped layer with a thickness from about 500 angstroms to 2000 angstroms and a doping concentration from about $5\times10^{18}$ cm$^{-3}$ to $1\times10^{20}$ cm$^{-3}$. The emitter layer 84 may be an n-doped layer with a thickness in the hundreds of angstroms and a doping concentration from about $10^{16}$ cm$^{-3}$ to $10^{18}$ cm$^{-3}$. The emitter interface layer 90 may be an n-doped layer with a thickness in the hundreds to thousands of angstroms and a doping concentration about $10^{19}$ cm$^{-3}$. The intermediate layer 92 may be an n-doped layer with a thickness in the hundreds of angstroms and a doping concentration about $10^{19}$ cm$^{-3}$. The emitter contact interface layer 94 may be an n-doped layer with a thickness in the hundreds of angstroms and a doping concentration about $10^{19}$ cm$^{-3}$.

The collector contacts 112, the base contact 116, and the emitter contacts 124 may be comprised of various metal layers. Those of ordinary skill in the art will appreciate that the principles of the present disclosure may be applied to transistors having contacts comprised of any material.

Figure 13:
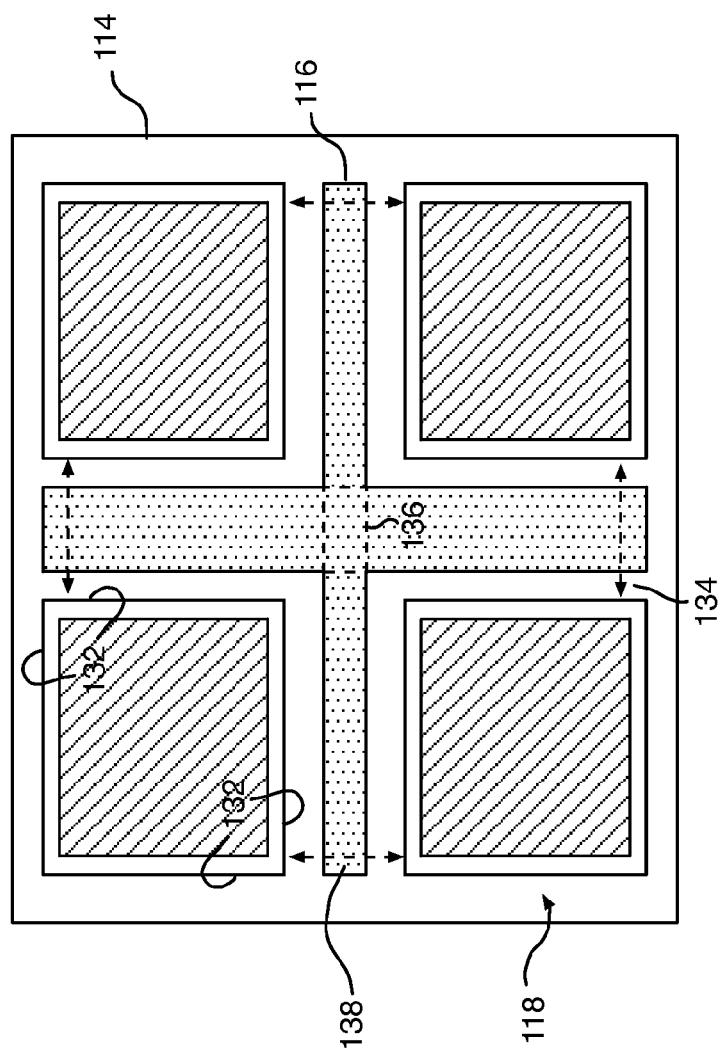
FIG. 13 shows a two-dimensional representation of the "square pie" geometric configuration shown in FIG. 12 according to one embodiment of the present disclosure.

FIG. 13 shows a two-dimensional representation of the "square pie" geometric configuration for the heterojunction bipolar transistor 106 shown in FIG. 12. As shown in FIGS. 12 and 13, the base mesa 110 is a pyramidal base including a flat rectangular surface opposite the sub-collector 108. The base mesa 110 may be a rectangle having a tapered outer edge. The emitter assembly 118 may be divided into four rectangular sections, each section including at least four perpendicular surfaces 132. The rectangular sections of the emitter assembly 118 may be spaced apart from one another, such that a sector gap 134 is formed between the adjacent perpendicular surfaces 132. The base contact 116 may be formed in an "X" shape, and may include a central portion 136 with four radial members 138. Each radial member 138 of the base contact 116 may extend outward from the central portion 136 along a corresponding sector gap 134, such that each one of the rectangular portions of the emitter assembly 118 is separated by a radial member 138 of the base contact 116.

According to one embodiment, the area of the emitter assembly 118 is approximately 320 μm$^2$. In additional embodiments, the area of the emitter assembly 118 may be approximately 90 μm$^2$ to 320 μm$^2$. Although four rectangular sections are shown in the emitter assembly 118 of FIGS. 12 and 13, any number of rectangular sections may be used in the emitter assembly 118 without departing from the principles of the present disclosure. Further, although four radial members 138 are shown in the base contact 116 of FIGS. 12 and 13, any number of radial members 138 may be used in the base contact 116 without departing from the principles of the present disclosure. In addition, each radial member 138 of the base contact 116 may be a different width without departing from the principles of the present disclosure.

By arranging the base contact 116 and the emitter assembly 118 in the "square pie" configuration, the emitter area to base-collector junction area ratio ($A_e/A_{bp}$) can be maintained relatively high when compared to conventional solutions, while the emitter perimeter to base contact perimeter ratio ($P_e/P_{bc}$) can be maintained relatively low. In doing so, the "square pie" geometric configuration allows for a balanced trade-off between the base-collector capacitance ($C_{bc}$) and the base resistance ($R_b$), thereby leading to increased performance of the heterojunction bipolar transistor 106 over a variety of operating conditions. Further, the "pie" geometric configuration offers a substantially reduced footprint when compared to conventional bar solutions, thereby saving space in a device in which the heterojunction bipolar transistor 106 is integrated.

Figure 14:
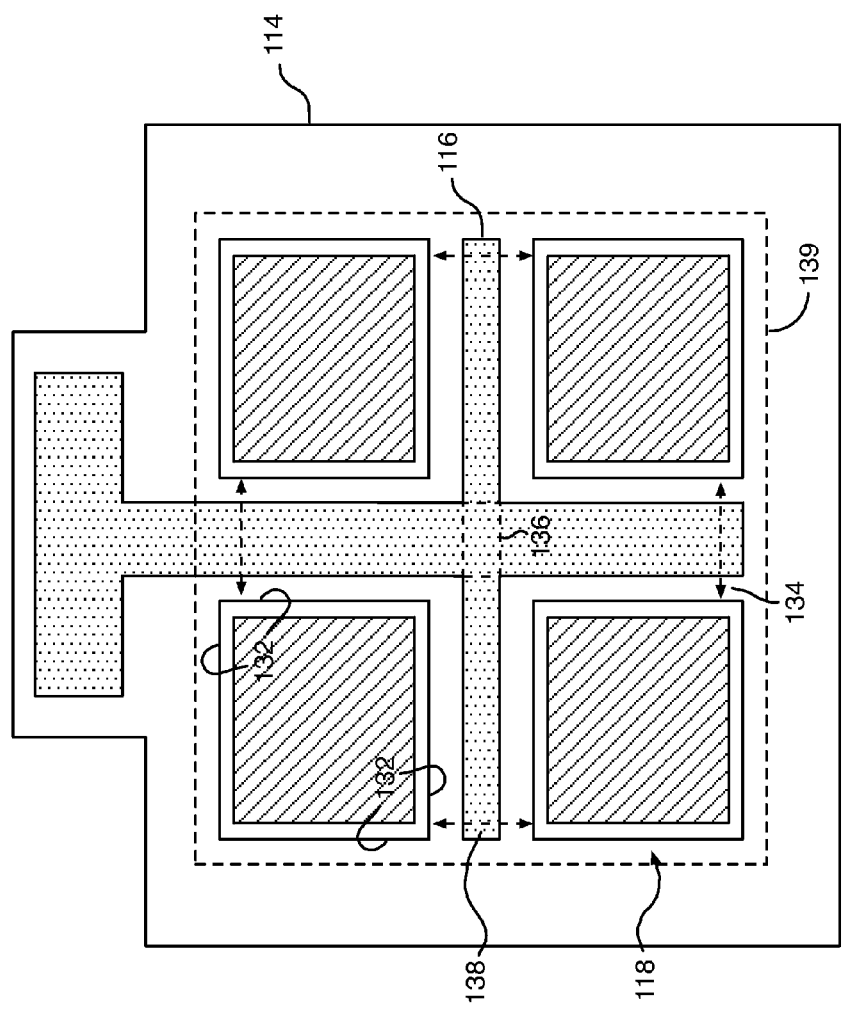
FIG. 14 shows a two-dimensional representation of the "square pie" geometric configuration shown in FIG. 12 according to an additional embodiment of the present disclosure.

According to an additional embodiment, the heterojunction bipolar transistor 106 shown in FIGS. 12 and 13 may further include additional metals to enable easier routing from the heterojunction bipolar transistor 106 to one or more interconnect metals. FIG. 14 shows a two-dimensional representation of the "pie" geometric configuration for the heterojunction bipolar transistor 106 shown in FIG. 12 according to such an embodiment. The heterojunction bipolar transistor 106 includes a common emitter contact layer 139 located on top of each one of the emitter contacts 124, which provides a common connection point for each one of the emitter contacts 124. Accordingly, each one of the emitter contacts 124 may be more conveniently accessed. In addition to the common emitter contact layer 139, the base contact 116 may be extended and shaped to provide easier access thereto, as shown in FIG.

14. By arranging the heterojunction bipolar transistor 106 as shown, the base contact 116 and the emitter contacts 124 may be more easily connected to one or more interconnect metals associated with the heterojunction bipolar transistor 106.

Figure 15:
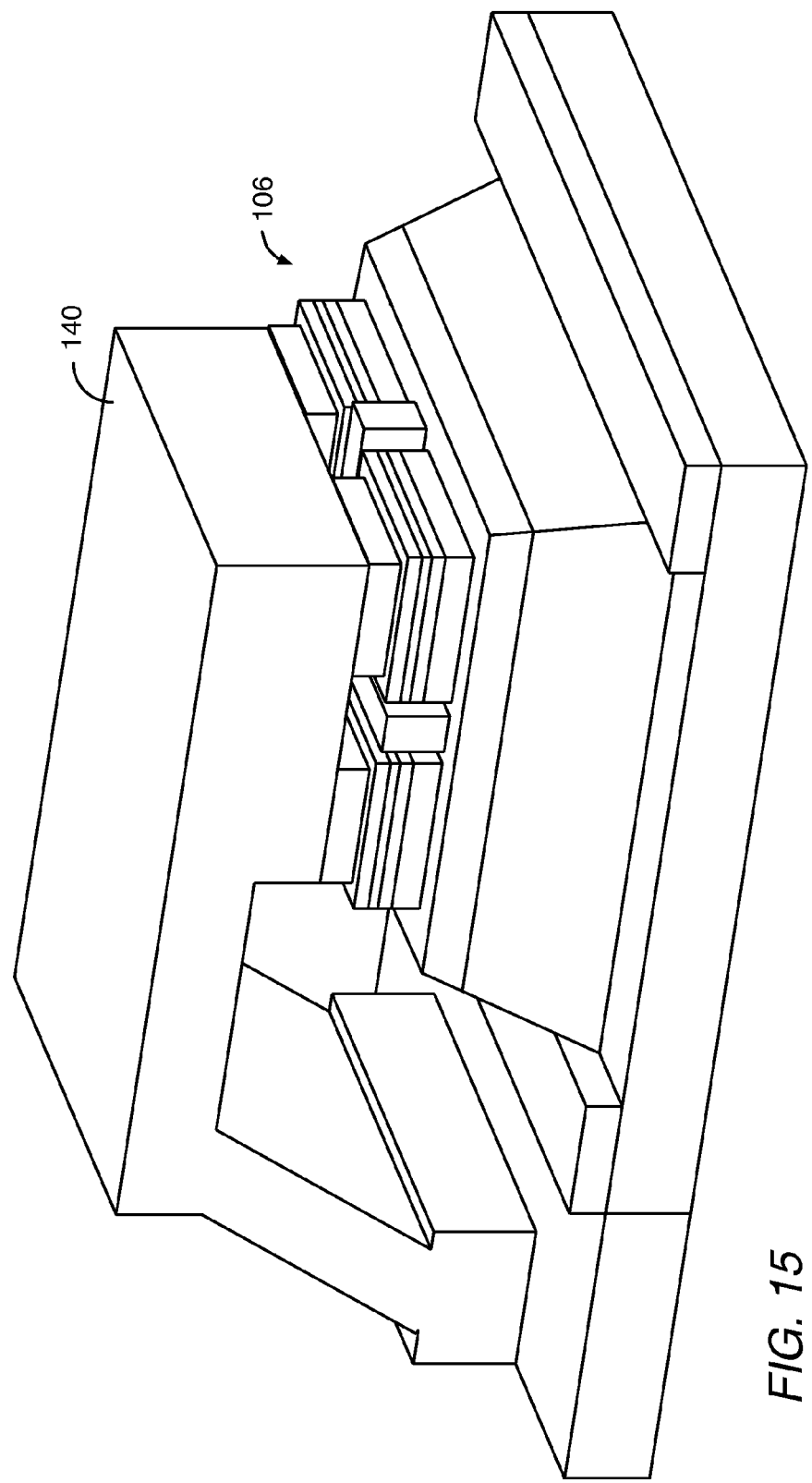
FIG. 15 shows a three-dimensional representation of a heterojunction bipolar transistor including a thermal shunt according to one embodiment of the present disclosure.

FIG. 15 shows the heterojunction bipolar transistor 106 shown in FIGS. 12 and 13 according to an additional embodiment of the present disclosure. The heterojunction bipolar transistor 106 shown in FIG. 15 is substantially similar to that shown in FIGS. 12 and 13, but further includes a thermal shunt 140 connected between the electrically isolated sub-collector 108 and the emitter contacts 124. As discussed above, as the current handled by the heterojunction bipolar transistor 106 increases, heat begins to accumulate in the emitter assembly 118. The accumulated heat in the emitter assembly 118 may lead to decreased performance of the heterojunction bipolar transistor 106, decreased longevity, or even failure of the device altogether. Accordingly, the thermal shunt 140 is provided to divert heat away from the emitter assembly 118 to the sub-collector 108. Diverting heat away from the emitter assembly 118 allows the heterojunction bipolar transmitter 106 to operate at higher currents for a given voltage, which increases device performance.

Those skilled in the art will recognize improvements and modifications to the embodiments of the present disclosure. All such improvements and modifications are considered within the scope of the concepts disclosed herein and the claims that follow.

What is claimed is:

1. A heterojunction bipolar transistor comprising:
a base mesa;
an emitter assembly formed over the base mesa and divided into a plurality of circular sectors that are spaced apart from one another such that a sector gap is formed between radial sides of adjacent circular sectors; and
a base contact formed over the base mesa and having a central portion and a plurality of radial members, each of the plurality of radial members extending outward from the central portion along a corresponding sector gap.

2. The heterojunction bipolar transistor of claim 1 wherein the base mesa is substantially cylindrical.

3. The heterojunction bipolar transistor of claim 1 further comprising a sub-collector on a surface of the base mesa opposite the emitter assembly.

4. The heterojunction bipolar transistor of claim 3 further comprising a thermal shunt coupled between the emitter assembly and the sub-collector and adapted to divert heat away from the emitter assembly.

5. The heterojunction bipolar transistor of claim 3 further comprising at least one collector contact adjacent to the base mesa on a surface of the sub-collector.

6. The heterojunction bipolar transistor of claim 1 wherein each one of the plurality of circular sectors of the emitter assembly comprises an emitter layer on top of the base mesa, an emitter cap layer on a surface of the emitter layer opposite the base mesa, and an emitter contact on a surface of the emitter cap layer opposite the emitter layer.

7. The heterojunction bipolar transistor of claim 6 wherein the emitter cap layer comprises an emitter interface layer, an intermediate layer, and an emitter contact interface layer, each one of the emitter interface layer, the intermediate layer, and the emitter contact interface layer having a different doping concentration.

8. The heterojunction bipolar transistor of claim 6 further comprising a sub-collector on a surface of the base mesa opposite the emitter assembly.

9. The heterojunction bipolar transistor of claim 8 further comprising at least one collector contact adjacent to the base mesa on a surface of the sub-collector.

10. The heterojunction bipolar transistor of claim 8 further comprising a thermal shunt coupled between each emitter contact on the plurality of circular sectors of the emitter assembly and a portion of the sub-collector, which is electrically isolated from the collector layer and collector contacts, wherein the thermal shunt is adapted to divert heat away from the emitter assembly.

11. The heterojunction bipolar transistor of claim 1 wherein the emitter assembly is divided into four circular sectors, and the base contact includes four radial members.

12. The heterojunction bipolar transistor of claim 1 wherein the emitter assembly is divided into eight circular sectors, and the base contact includes eight radial members.

13. A heterojunction bipolar transistor comprising:
A base mesa;
an emitter assembly formed over the base mesa and divided into a plurality of rectangular portions that are spaced apart from one another such that a sector gap is formed between lateral sides of adjacent rectangular portions; and
a base contact formed over the base mesa and having a central portion and a plurality of radial members, each of the plurality of radial members extending outward from the central portion along a corresponding sector gap.

14. The heterojunction bipolar transistor of claim 13 wherein the base mesa is substantially rectangular.

15. The heterojunction bipolar transistor of claim 13 further comprising a sub-collector on a surface of the base mesa opposite the emitter assembly.

16. The heterojunction bipolar transistor of claim 15 further comprising a thermal shunt coupled between the emitter assembly and the sub-collector and adapted to divert heat away from the emitter assembly.

17. The heterojunction bipolar transistor of claim 13 further comprising at least one collector contact adjacent to the base mesa on a surface of the sub-collector.

18. The heterojunction bipolar transistor of claim 13 wherein each one of the plurality of rectangular portions of the emitter assembly comprises an emitter layer on top of the base mesa, an emitter cap layer on a surface of the emitter layer opposite the base mesa, and an emitter contact on a surface of the emitter cap layer opposite the emitter layer.

19. The heterojunction bipolar transistor of claim 18 wherein the emitter cap layer comprises an emitter interface layer, an intermediate layer, and an emitter contact interface layer, each one of the emitter interface layer, the intermediate layer, and the emitter contact interface layer having a different doping concentration.

20. The heterojunction bipolar transistor of claim 18 further comprising a sub-collector on a surface of the base mesa opposite the emitter assembly.

21. The heterojunction bipolar transistor of claim 20 further comprising at least one collector contact adjacent to the base mesa on a surface of the sub-collector.

22. The heterojunction bipolar transistor of claim 20 further comprising a thermal shunt coupled between each emitter contact on the plurality of rectangular portions of the emitter assembly and a portion of the sub-collector, which is electrically isolated from the collector layer and collector contacts, wherein the thermal shunt is adapted to divert heat away from the emitter assembly.

23. The heterojunction bipolar transistor of claim 13 wherein the emitter assembly is divided into four rectangular portions, and the base contact includes four radial members.

24. The heterojunction bipolar transistor of claim 13 wherein the emitter assembly is divided into eight rectangular portions, and the base contact includes eight radial members.

\* \* \* \* \*